United States Patent
Tu et al.

(10) Patent No.: US 9,929,114 B1
(45) Date of Patent: Mar. 27, 2018

(54) BONDING PAD STRUCTURE HAVING ISLAND PORTIONS AND METHOD FOR MANUFACTURING THE SAME

(71) Applicant: Vanguard International Semiconductor Corporation, Hsinchu (TW)

(72) Inventors: Chi-Li Tu, Cyonglin Township (TW); Hung-Wei Chen, Jhubei (TW); Shi-Hsiang Lu, Hsinchu (TW); Ching-Wen Wang, Hemei Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/341,766

(22) Filed: Nov. 2, 2016

(51) Int. Cl.
  *H01L 23/52* (2006.01)
  *H01L 23/00* (2006.01)
  *H01L 23/522* (2006.01)
  *H01L 23/528* (2006.01)
  *H01L 21/768* (2006.01)

(52) U.S. Cl.
  CPC ........ *H01L 24/05* (2013.01); *H01L 21/76816* (2013.01); *H01L 21/76877* (2013.01); *H01L 23/5226* (2013.01); *H01L 23/5283* (2013.01); *H01L 24/03* (2013.01); *H01L 2224/04042* (2013.01); *H01L 2224/05013* (2013.01); *H01L 2224/05025* (2013.01); *H01L 2224/05124* (2013.01); *H01L 2224/05147* (2013.01); *H01L 2924/351* (2013.01)

(58) Field of Classification Search
  CPC ..... H01L 24/05; H01L 24/03; H01L 23/5226; H01L 23/5283
  See application file for complete search history.

(56) References Cited

U.S. PATENT DOCUMENTS

| | | | | |
|---|---|---|---|---|
| 6,100,573 A | * | 8/2000 | Lu | ............................ H01L 24/05 257/508 |
| 6,124,195 A | * | 9/2000 | Duesman | ............... H01L 23/525 257/E23.146 |
| 7,397,127 B2 | * | 7/2008 | Lin | ........................... H01L 24/03 257/773 |
| 7,642,653 B2 | * | 1/2010 | Kuzuhara | ......... H01L 21/76838 257/506 |

(Continued)

*Primary Examiner* — Ida M Soward
(74) *Attorney, Agent, or Firm* — Birch, Stewart, Kolasch & Birch, LLP

(57) ABSTRACT

A bonding pad structure is provided. The structure includes a dielectric layer on a substrate. A bonding pad is disposed on the dielectric layer and a first metal pattern layer is embedded in the dielectric layer and directly below the bonding pad. The first metal pattern layer includes a first body portion and first island portions. The first body portion has first openings in a central region of the first body portion and second openings arranged along a peripheral region of the first body portion and surrounding the first openings. The first island portions are correspondingly disposed in the second openings and spaced apart from the first body portion. First interconnect structures are disposed in the dielectric layer and correspond to the first island portions, such that the bonding pad is electrically connected to the first island portions.

10 Claims, 8 Drawing Sheets

(56) References Cited

U.S. PATENT DOCUMENTS

| | | | | |
|---|---|---|---|---|
| 7,701,070 B1* | 4/2010 | Li | | H01L 23/528 |
| | | | | 257/781 |
| 7,883,917 B2* | 2/2011 | Liu | | H01L 24/05 |
| | | | | 257/447 |
| 7,969,008 B2* | 6/2011 | Nagai | | H01L 21/76826 |
| | | | | 257/306 |
| 8,642,986 B2* | 2/2014 | Tan | | B81C 1/00238 |
| | | | | 257/115 |
| 8,872,303 B2* | 10/2014 | Weng | | H01L 21/76838 |
| | | | | 257/503 |
| 9,245,083 B2* | 1/2016 | Lamorey | | H01L 21/76883 |
| 9,589,887 B2* | 3/2017 | Watanabe | | H01L 23/48 |
| 2004/0036174 A1* | 2/2004 | Downey | | H01L 24/03 |
| | | | | 257/758 |
| 2005/0161835 A1* | 7/2005 | Maeda | | H01L 22/32 |
| | | | | 257/786 |
| 2005/0266612 A1* | 12/2005 | Lin | | H01L 21/768 |
| | | | | 438/108 |
| 2006/0154469 A1* | 7/2006 | Hess | | H01L 23/522 |
| | | | | 438/618 |
| 2006/0180946 A1* | 8/2006 | Chen | | H01L 24/05 |
| | | | | 257/786 |
| 2006/0207790 A1* | 9/2006 | Choi | | H01L 24/05 |
| | | | | 174/262 |
| 2006/0226547 A1* | 10/2006 | Wang | | H01L 24/05 |
| | | | | 257/758 |
| 2007/0018331 A1* | 1/2007 | Chen | | H01L 23/562 |
| | | | | 257/774 |
| 2008/0122039 A1* | 5/2008 | Liu | | H01L 24/03 |
| | | | | 257/620 |
| 2008/0290516 A1* | 11/2008 | Oda | | H01L 23/53238 |
| | | | | 257/751 |
| 2009/0294994 A1* | 12/2009 | Wu | | H01L 24/05 |
| | | | | 257/780 |
| 2013/0075931 A1* | 3/2013 | Su | | H01L 24/05 |
| | | | | 257/774 |
| 2015/0061145 A1* | 3/2015 | Nakao | | H01L 21/7684 |
| | | | | 257/773 |
| 2016/0307859 A1* | 10/2016 | Lin | | H01L 24/05 |

* cited by examiner

BONDING PAD STRUCTURE HAVING ISLAND PORTIONS AND METHOD FOR MANUFACTURING THE SAME

BACKGROUND

Field of the Disclosure

The present disclosure relates to a semiconductor technology, and in particular, it relates to a bonding pad structure and a method for manufacturing the same.

Description of the Related Art

In a semiconductor chip, bonding pads are necessary components for electrically connecting an integrated circuit (IC) of the chip to an exterior circuit. Conventionally, to protect the integrated circuit IC of the chip from damage, such an integrated circuit would not be arranged in a position directly below the bonding pads. As a result, since the integrated circuit does not overlap the position of the bonding pads, the semiconductor chip needs a larger area to provide enough space for arrangement of the bonding pads. Although the semiconductor industry continues to improve the integration density of various electronic components (e.g., transistors, diodes, resistors, capacitors, etc.) by continual reductions in minimum feature size, it is still difficult to provide enough area/space for arrangement of electronic components and bonding pads in such a semiconductor chip.

Accordingly, it is forcing integrated circuit designers to use the chip area as efficiently as possible. For example, a technology which is referred to as circuit under pad (CUP) structure has been proposed, which arranges the bonding pad directly above the circuits or electronic components inside the chip to reduce the chip area. In such a bonding pad structure, the uppermost metal layer is used as a bonding pad, while the lower metal layer and via plugs arranged in an array between the uppermost metal layer and the lower metal layer are employed for signal transmission.

However, such a bonding pad structure is not always sufficiently robust. For example, stresses generated from the wire bonding process are easily propagated through the via plugs, and can damage the bonding pad structure, so that electrical conduction fails.

Therefore, there is a need to develop a bonding pad structure and a method for manufacturing the same that are capable of addressing or mitigating the problems described above.

SUMMARY

In some embodiments of the disclosure, a bonding pad structure is provided. The bonding pad structure includes a dielectric layer on a substrate. A bonding pad is disposed on the dielectric layer. A first metal pattern layer is embedded in the dielectric layer and directly below the bonding pad. The first metal pattern layer includes a first body portion having a plurality of first openings in a central region of the first body portion and a plurality of second openings arranged along a peripheral region of the first body portion and surrounding the plurality of first openings, and a plurality of first island portions correspondingly disposed in the plurality of second openings and spaced apart from the first body portion. A plurality of first interconnect structures is disposed in the dielectric layer and corresponds to the plurality of first island portions, such that the bonding pad is electrically connected to the plurality of first island portions. Each of the first interconnect structures comprises at least one via plug.

In some embodiments of the disclosure, a method for fabricating a bonding pad structure is provided. The method includes forming a dielectric layer on a substrate. A first metal pattern layer is formed in the dielectric layer. The first metal pattern layer includes a first body portion having a plurality of first openings in a central region of the first body portion and a plurality of second openings arranged along a peripheral region of the first body portion and surrounding the plurality of first openings, and a plurality of first island portions correspondingly disposed in the plurality of second openings and spaced apart from the first body portion. A plurality of first interconnect structures is formed in the dielectric layer and corresponds to the plurality of first island portions. Each of the first interconnect structures comprises at least one via plug. A bonding pad is formed on the dielectric layer and directly above the first metal pattern layer, such that the bonding pad is electrically connected to the plurality of first island portions through the plurality of first interconnect structures.

BRIEF DESCRIPTION OF THE DRAWINGS

The present disclosure can be further understood by reading the subsequent detailed description and examples with references made to the accompanying drawings, wherein.

DETAILED DESCRIPTION

Figure 1A:
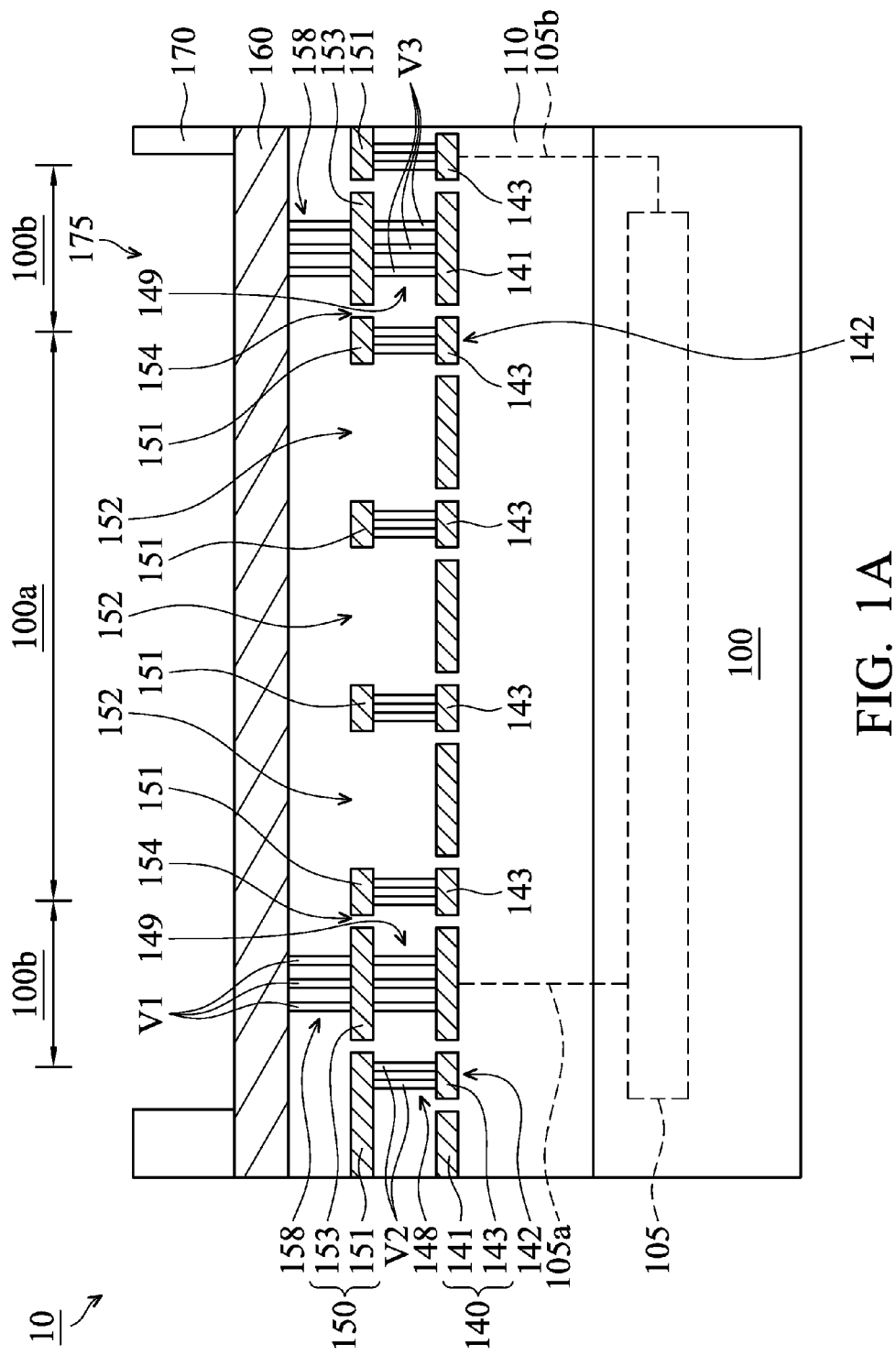
FIG. 1A is a cross section of a bonding pad structure according to an embodiment of the present disclosure.

The following description is of the best-contemplated mode of carrying out the disclosure. This description is made for the purpose of illustrating the general principles of the disclosure and should not be taken in a limiting sense. These are, of course, merely examples and are not intended to be limited. In addition, the disclosure may repeat reference numerals and/or letters in the various examples. This repetition is for the purpose of simplicity and clarity and does not in itself dictate a relationship between the various embodiments and/or configurations discussed.

An exemplary embodiment of the present disclosure provides a bonding pad structure, such as a circuit under pad (CUP) structure, which utilizes a metal pattern layer having hollowed-out patterns and island patterns disposed below a bonding pad, and interconnect structures (e.g., via plugs)

disposed between the bonding pad and the metal pattern layer to enhance the mechanical strength of the bonding pad, while utilizing the metal pattern layer to transmit two different signals.

Figure 1B:
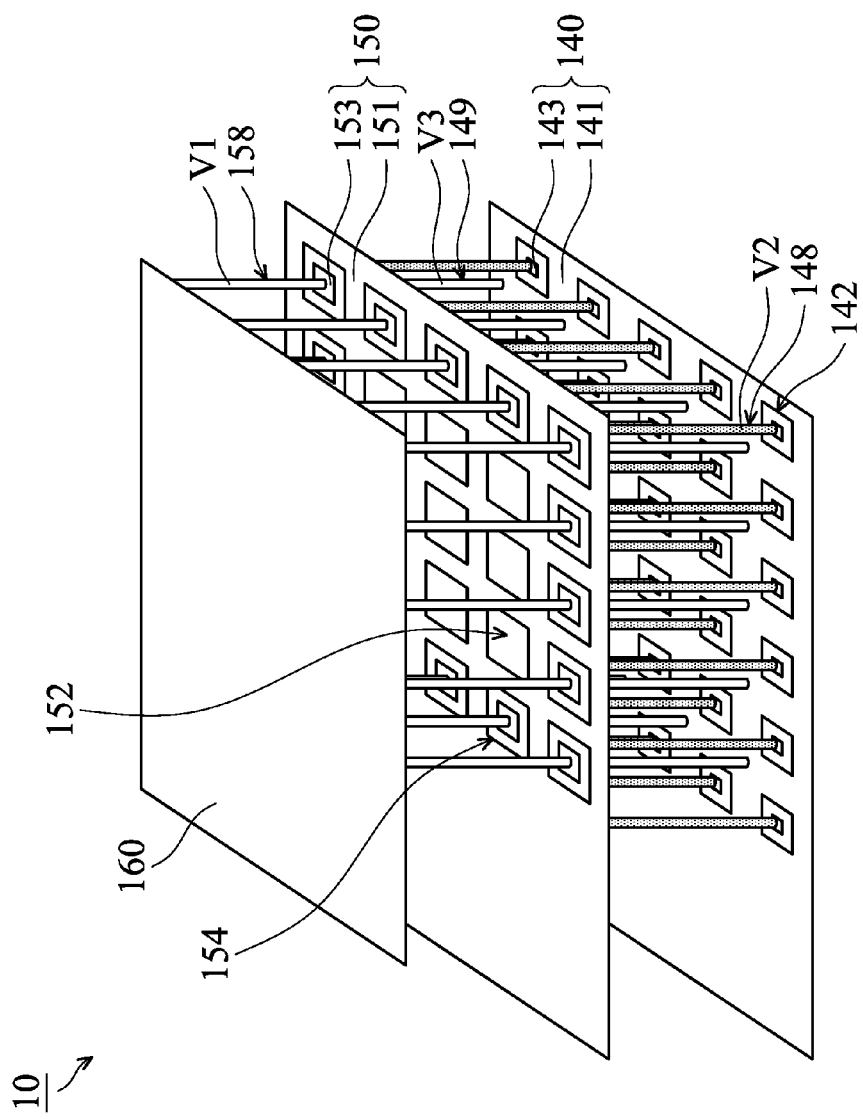
FIG. 1B is a perspective diagram showing a configuration of metal pattern layers and interconnect structures in the bonding pad structure shown in FIG. 1A.

Refer to FIGS. 1A and 1B, which respectively illustrate a cross section of a bonding pad structure 10 according to an embodiment of the present disclosure and a perspective diagram showing a configuration of metal pattern layers and interconnect structures in the bonding pad structure shown in FIG. 1A. In the embodiment, the bonding pad structure 10 is a circuit under pad (CUP) structure.

As shown in FIG. 1A, the bonding pad structure 10 may include a substrate 100, such as a silicon substrate, a SiGe substrate, a bulk semiconductor substrate, a compound semiconductor substrate, a silicon-on-insulator (SOI) substrate, or another well-known semiconductor substrate. In one embodiment, the substrate 100 is a silicon substrate and includes an interlayer dielectric (ILD) layer (not shown) formed thereon. Moreover, the substrate 100 may include a circuit 105 therein. In one embodiment, the circuit 105 includes an analog circuit, an input/output circuit, an electrostatic discharge (ESD) circuit, or a memory circuit. In one embodiment, the circuit 105 includes active or passive devices, such as transistors, diodes, capacitors, or resistors. Moreover, the circuit 105 also includes metal routing layers for these active or passive devices. In order to simplify the diagram, herein only a dashed-line region is depicted.

In the embodiment, the bonding pad structure 10 further includes a dielectric layer 110 that is disposed over the substrate 100, as shown in FIG. 1A. In one embodiment, the dielectric layer 110 is an inter-metal dielectric (IMD) layer and includes a single layer or a multi-layer structure. For example, the dielectric layer 110 includes a multi-layer structure. In order to simplify the diagram, herein only a flat layer is depicted. In some embodiments, the dielectric layer 110 includes an inorganic material, such as silicon oxide, silicon nitride, silicon oxynitride, or a combination thereof, or another suitable insulating material.

In the embodiment, the bonding pad structure 10 further includes a bonding pad 160 disposed over the dielectric layer 110, in which the circuit 105 in the substrate 100 is directly below the bonding pad 160, as shown in FIGS. 1A and 1B. In one embodiment, the bonding pad 160 is a solid layer with a rectangular shape. In some embodiments, the bonding layer 160 may have other shapes, such as a square shape, a polygon shape, or a circular shape. Moreover, the bonding pad 160 may be formed of aluminum, copper, or an alloy thereof, or another suitable metal material.

In the embodiment, the bonding pad structure 10 further includes a passivation layer 170 which has an opening 175 to substantially expose an upper surface of the bonding pad 160. The passivation layer 170 may include epoxy resin, solder mask, or another suitable insulating material.

In the embodiment, the bonding pad structure 10 further includes a first metal pattern layer 150 embedded in a first level of the dielectric layer 110 and directly below the bonding pad 160, as shown in FIGS. 1A and 1B. In one embodiment, the first metal pattern layer 150 is an uppermost metal layer in an IMD layer. Moreover, the first metal pattern layer 150 includes a first body portion 151 and first island portions 153.

The first body portion 151 may have a shape that is the same as, similar to, or different from the shape of the bonding pad 160. For example, the first body portion 151 has a rectangular shape. In one embodiment, the first body portion 151 has first openings 152 located at a central region 100a of the first body portion 151 and second openings 154 arranged along a peripheral region 100b and surrounding the first openings 152. For example, the first openings 152 are arranged in an array, while the second openings 154 are arranged in a ring shape that surrounds the array. Moreover, both the first opening 152 and the second opening 154 are rectangular openings. In some embodiments, both the first opening 152 and the second opening 154 have a square shape, a polygon shape, or a circular shape. It should be understood that the number, the shapes, and the sizes of the first opening 152 and the second opening 154 may be based on the area of the bonding pad 160 and design demands and are not limited to these shown in the embodiment of FIG. 1B.

The first island portions 153 are correspondingly disposed in the second openings 154 and spaced apart from the first body portion 151. In the embodiment, the dielectric layer 110 may entirely fill each of the first openings 151 and the gap that is in each of the second openings 154 and between the first body portion 151 and the corresponding first island portion 153. In one embodiment, the first island portion 153 has a shape that is the same as, similar to, or different from the shape of the second opening 154. For example, the shape of the first island portion 153 is rectangular.

In the embodiment, the bonding pad structure 10 further includes first interconnect structures 158 disposed in the dielectric layer 110 and corresponding to the first island portions 153, such that the bonding pad 160 is electrically connected to the first island portions 153, as shown in FIGS. 1A and 1B. In one embodiment, each of the first interconnect structures 158 may include one or more via plugs V1. For example, the first interconnect structure 158 includes three via plugs V1, as shown in FIG. 1A. Additionally, in order to simplify the diagram, only a single via plug V1 is depicted in FIG. 1B to represent each of the first interconnect structures 158. However, it should be understood that the number of via plugs V1 is based on the area of the first island portion 153 and the design demands and is not limited to the embodiment shown in FIG. 1A. In one embodiment, the via plug V1 is formed of copper, aluminum, or an alloy thereof.

In the embodiment, the bonding pad structure 10 further includes a second metal pattern layer 140 embedded in a second level of the dielectric layer 110, as shown in FIGS. 1A and 1B. The second metal pattern layer 140 is directly below the first metal pattern layer 150 and adjacent thereto. In one embodiment, the second metal pattern layer 140 has a structure that is similar to that of the first metal pattern layer 150. For example, the second metal pattern layer 140 includes a second body portion 141 and second island portions 143.

The second body portion 141 may have a shape that is the same as, similar to, or different from the shape of the first metal pattern layer 150. For example, the second body portion 141 has a rectangular shape. In one embodiment, the second body portion 141 has third openings 142 that are arranged to stagger the first openings 152 and second openings 154. Namely, the first openings 152 and second openings 154 do not overlap the third openings 142, as viewed from the top. Moreover, the third opening 142 may be a rectangular opening. In some embodiments, the third opening 142 has a square shape, a polygon shape, or a circular shape. It should be understood that the number, the shapes, and the sizes of the third opening 142 may be based on the area of the first body portion 151 and design demands and are not limited to these shown in the embodiment of FIG. 1B.

The second island portions 143 are correspondingly disposed in the third openings 142 and spaced apart from the second body portion 141. In the embodiment, the dielectric layer 110 may entirely fill the gap that is in each of the third openings 154 and between the second body portion 141 and the corresponding second island portion 143. In one embodiment, the second island portion 143 has a shape that is the same as, similar to, or different from the shape of the third opening 142. For example, the shape of the second island portion 143 is rectangular.

In the embodiment, the bonding pad structure 10 further includes second interconnect structures 148 and third interconnect structures 149 disposed in the dielectric layer 110, as shown in FIGS. 1A and 1B. The second interconnect structures 148 correspond to the second island portions 143, such that the first body portion 151 is electrically connected to the second island portions 143. Moreover, the third interconnect structures 149 correspond to the first island portions 153, such that the second body portion 141 is electrically connected to the first island portions 153. In one embodiment, the second body portion 141 may be electrically connected to a first signal terminal of the circuit 105 (as indicated by the dashed-line 105a), such that the bonding pad 160 is electrically connected to the first signal terminal of the circuit 105. Moreover, the second island portions 143 may be electrically connected to a second signal terminal of the circuit 105 that is different from the first signal terminal (as indicated by the dashed-line 105b), such that the first body portion 151 is electrically connected to the second signal terminal of the circuit 105. For example, the circuit 105 includes a transistor. The bonding pad 160 is electrically connected to the source of the transistor, while the first body portion 151 is electrically connected to the drain or gate of the transistor.

In one embodiment, each of the second interconnect structures 148 may include one or more via plugs V2. For example, the second interconnect structure 148 includes two via plugs V2, as shown in FIG. 1A. Additionally, in order to simplify the diagram, only a single via plug V2 is depicted in FIG. 1B to represent each of the second interconnect structures 148. However, it should be understood that the number of via plugs V2 is based on the area of the second island portion 143 and the design demands and is not limited to the embodiment shown in FIG. 1A. Similarly, each of the third interconnect structures 149 may include one or more via plugs V3. For example, the third interconnect structure 149 includes two via plugs V3, as shown in FIG. 1A. Additionally, in order to simplify the diagram, only a single via plug V3 is depicted in FIG. 1B to represent each of the third interconnect structures 149. However, it should be understood that the number of via plugs V3 is based on the area of the first island portion 153 and the design demands and is not limited to the embodiment shown in FIG. 1A. The number of via plugs V1 of each first interconnect structure 158 may be the same as or different from the number of via plugs V2 of each second interconnect structure 148 or the number of via plugs V3 of each third interconnect structure 149. In one embodiment, the via plugs V2 and V3 are formed of a material that is the same as or similar to that of the via plug V1.

In the embodiment, the bonding pad structure 10 may be formed by conventional deposition, lithography, and etching processes. For example, a dielectric layer 110 is formed over a substrate 100 by a deposition process (e.g., a chemical vapor deposition process). Moreover, a second metal pattern layer 140, second interconnect structures 148 and third interconnect structures 149, a first metal pattern layer 150, and first interconnect structures 158 are successively formed in the dielectric layer 110 by a deposition process (e.g., a chemical vapor deposition process or a physical vapor deposition process), a lithography process, and an etching process (e.g., a dry etching process or a wet etching process). Thereafter, a bonding pad 160 is formed on the dielectric layer 110 by a deposition process (e.g., a chemical vapor deposition process or a physical vapor deposition process), a lithography process, and an etching process (e.g., a dry etching process or a wet etching process). A passivation layer 170 is formed on the bonding pad 160 and the dielectric layer 110 by a deposition process (e.g., a chemical vapor deposition process or a physical vapor deposition process), a lithography process, and an etching process (e.g., a dry etching process or a wet etching process).

Figure 2A:
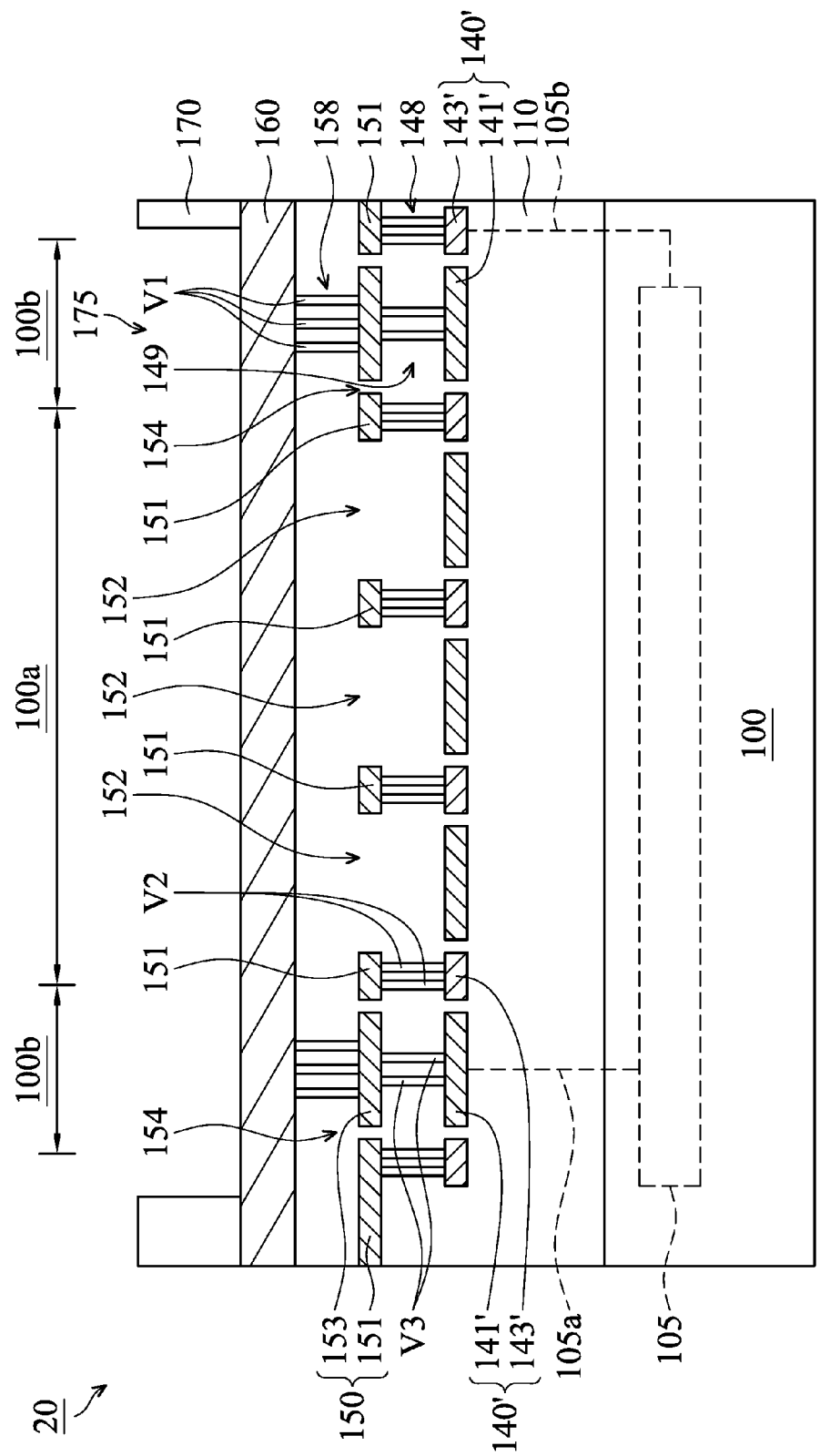
FIG. 2A is a cross section of a bonding pad structure according to an embodiment of the present disclosure.
Figure 2B:
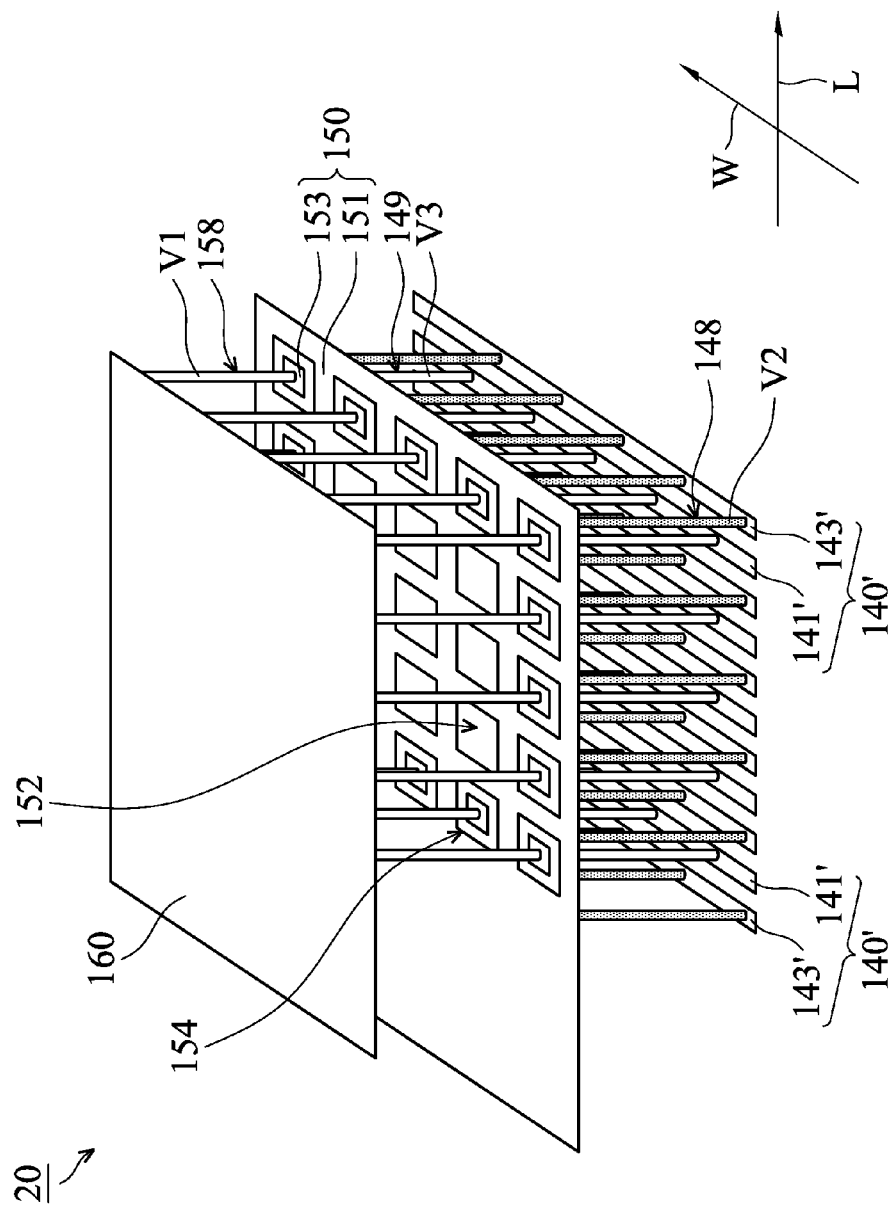
FIG. 2B is a perspective diagram showing a configuration of metal pattern layers and interconnect structures in the bonding pad structure shown in FIG. 2A.

Refer to FIGS. 2A and 2B, which respectively illustrate a cross section of a bonding pad structure 20 according to an embodiment of the present disclosure and a perspective diagram showing a configuration of metal pattern layers and interconnect structures in the bonding pad structure shown in FIG. 2A. Elements in FIGS. 2A and 2B that are the same as or similar to those in FIGS. 1A and 1B are not described again, for brevity. In the embodiment, the bonding pad structure 20 has a structure that is similar to the bonding pad structure 10 shown in FIGS. 1A and 1B except for the structure and configuration of the second metal pattern layer 140'.

Unlike the second metal pattern layer 140 of the bonding pad structure 10, the second metal pattern layer 140' that is directly below the first metal pattern layer 150 may include first strip portions 143' and second strip portions 141'. The first strip portions 143' and the second strip portions 141' are parallel to each other and alternately arranged. Moreover, each of the second strip portions 141' is aligned to at least one of the first island portions 153, and the first strip portions 143' are arranged to stagger the first openings 152 and the second openings 154. Namely, the first openings 152 and the second openings 154 do not overlap the first strip portions 143' as viewed from the top. In one embodiment, the bonding pad 160 and the first body portion 151 of the first metal pattern layer 150 have a rectangular shape. In this case, the first strip portions 143' and the second strip portions 141' are arranged in parallel to a width direction W of the rectangular shape.

As shown in FIGS. 2A and 2B, in the embodiment, the second interconnect structures 148 of the bonding pad structure 20 correspond to the first strip portions 143', such that the first body portion 151 is electrically connected to the first strip portions 143'. Moreover, the third interconnect structures 149 correspond to the second strip portions 141', such that the second strip portions 141' are electrically connected to the first island portions 153. In one embodiment, the second strip portions 141' may be electrically connected to a first signal terminal of the circuit 105 (as indicated by the dashed-line 105a), such that the bonding pad 160 is electrically connected to the first signal terminal of the circuit 105. Moreover, the first strip portions 143' may be electrically connected to a second signal terminal of the circuit 105 that is different from the first signal terminal (as indicated by the dashed-line 105b), such that the first body portion 151 is electrically connected to the second signal terminal of the circuit 105.

In one embodiment, each of the second interconnect structures 148 may include one or more via plugs V2 and each of the third interconnect structures 149 may include one or more via plugs V3. For example, the second interconnect structure 148 includes two via plugs V2, and the third interconnect structure 149 includes two via plugs V3, as shown in FIG. 2A, but it is not limited thereto. Additionally, in order to simplify the diagram, only a single via plug V2 is depicted in FIG. 2B to represent each of the second interconnect structures 148, while only a single via plug V3 is depicted in FIG. 2B to represent each of the third interconnect structures 149. Moreover, the number of via plugs V1 of each first interconnect structure 158 may be the same as or different from the number of via plugs V2 of each second interconnect structure 148 or the number of via plugs V3 of each third interconnect structure 149.

In the embodiment, it should be understood that the bonding pad structure 20 may be formed by a method that is the same as or similar to the one used in manufacturing the bonding pad structure 10.

Figure 3A:
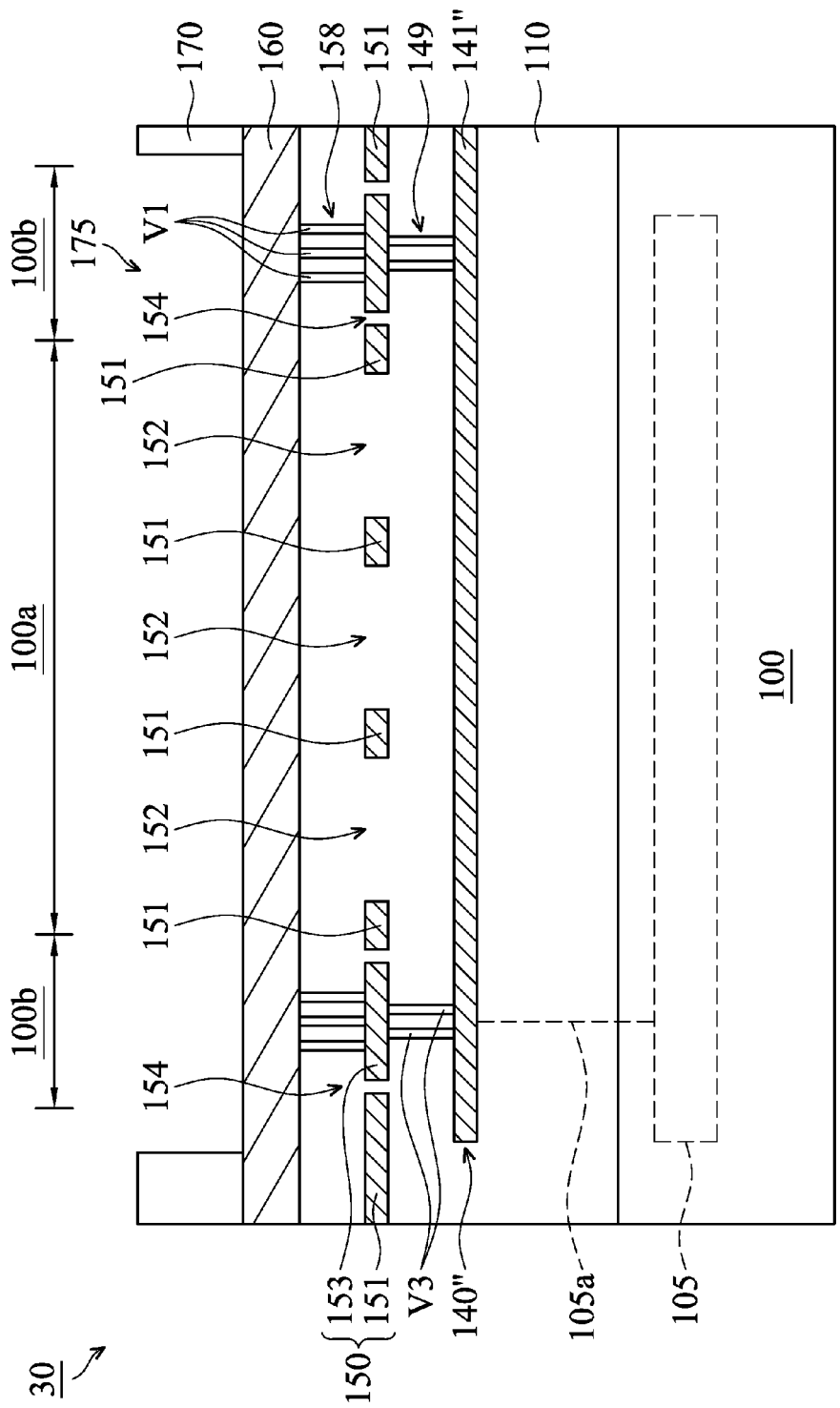
FIG. 3A is a cross section of a bonding pad structure according to an embodiment of the present disclosure.
Figure 3B:
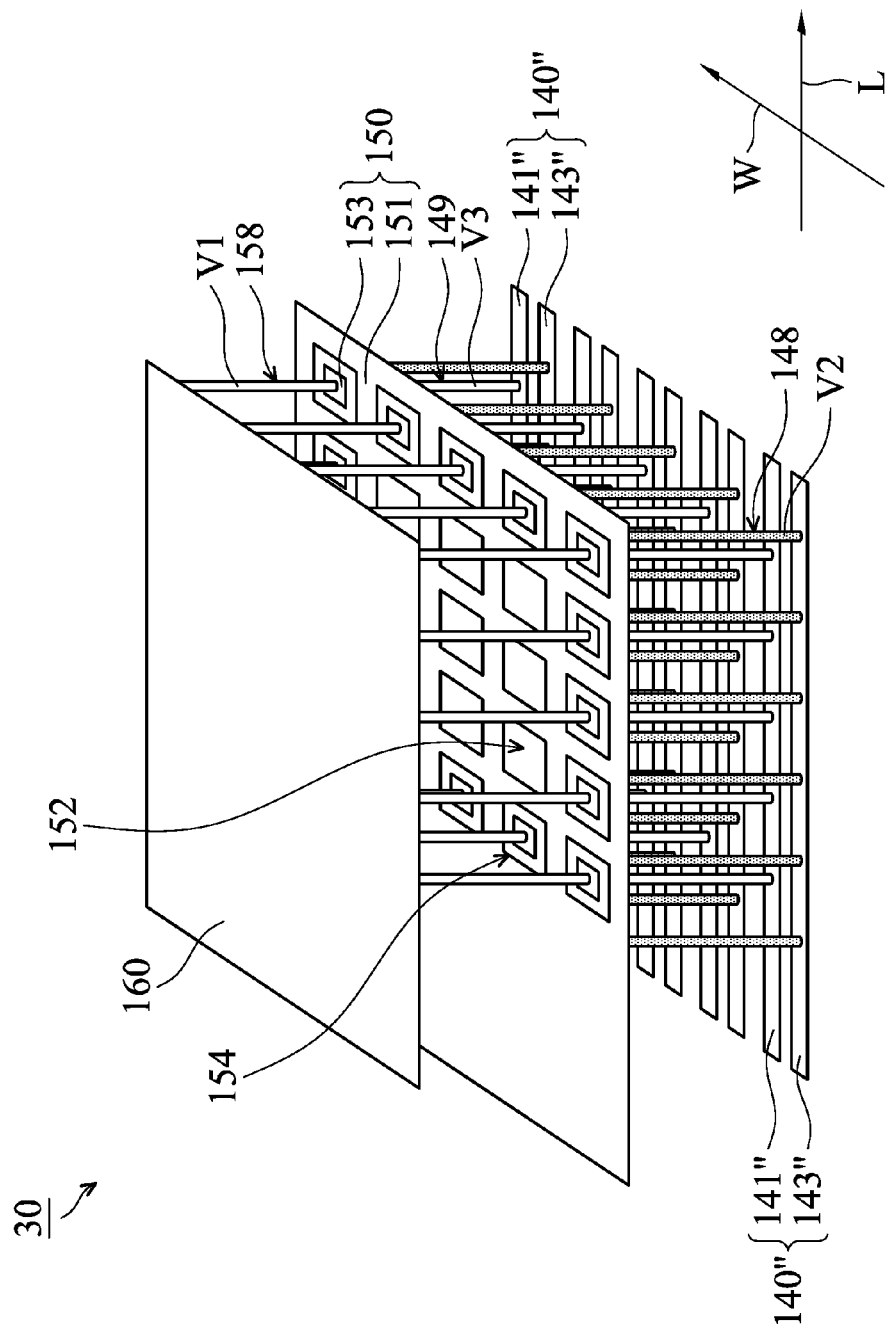
FIG. 3B is a perspective diagram showing a configuration of metal pattern layers and interconnect structures in the bonding pad structure shown in FIG. 3A.

Refer to FIGS. 3A and 3B, which respectively illustrate a cross section of a bonding pad structure 30 according to an embodiment of the present disclosure and a perspective diagram showing a configuration of metal pattern layers and interconnect structures in the bonding pad structure shown in FIG. 3A. Elements in FIGS. 3A and 3B that are the same as or similar to those in FIGS. 2A and 2B are not described again, for brevity. In the embodiment, the bonding pad structure 30 has a structure that is similar to the bonding pad structure 20 shown in FIGS. 2A and 2B except for the structure and configuration of the second metal pattern layer 140".

Unlike the second metal pattern layer 140' of the bonding pad structure 20, the second metal pattern layer 140" that is directly below the first metal pattern layer 150 may include first strip portions 143" and second strip portions 141". The first strip portions 143" and the second strip portions 141" are parallel to each other and alternately arranged. In the embodiment, the first strip portions 143' and the second strip portions 141' are arranged in parallel to a length direction L of the rectangular shape of the bonding pad 160 and the first metal pattern layer 150. Moreover, each of the second strip portions 141" is aligned to at least one of the first island portions 153, and the first strip portions 143" are arranged to stagger the first openings 152 and the second openings 154. Namely, the first openings 152 and the second openings 154 do not overlap the first strip portions 143" as viewed from the top.

As shown in FIGS. 3A and 3B, in the embodiment, the second interconnect structures 148 of the bonding pad structure 30 correspond to the first strip portions 143", such that the first body portion 151 is electrically connected to the first strip portions 143". Moreover, the third interconnect structures 149 correspond to the second strip portions 141", such that the second strip portions 141" are electrically connected to the first island portions 153. In one embodiment, the second strip portions 141" may be electrically connected to a first signal terminal of the circuit 105 (as indicated by the dashed-line 105a), such that the bonding pad 160 is electrically connected to the first signal terminal of the circuit 105. Moreover, the first strip portions 143" may be electrically connected to a second signal terminal of the circuit 105 that is different from the first signal terminal (not shown), such that the first body portion 151 is electrically connected to the second signal terminal of the circuit 105.

In the embodiment, it should be understood that the bonding pad structure 30 may be formed by a method that is the same as or similar to the one used in manufacturing the bonding pad structure 10 or the bonding pad structure 20.

Figure 4A:
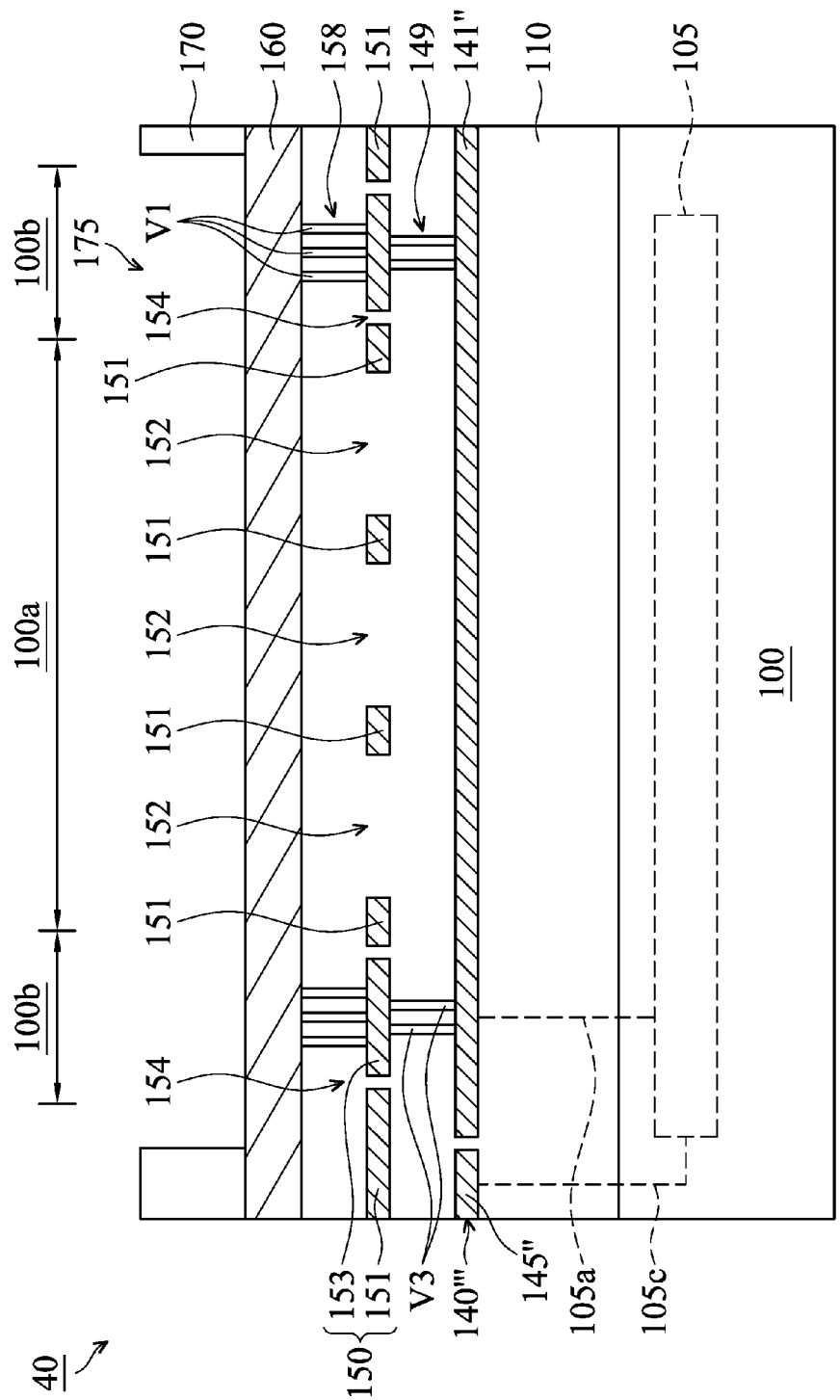
FIG. 4A is a cross section of a bonding pad structure according to an embodiment of the present disclosure.
Figure 4B:
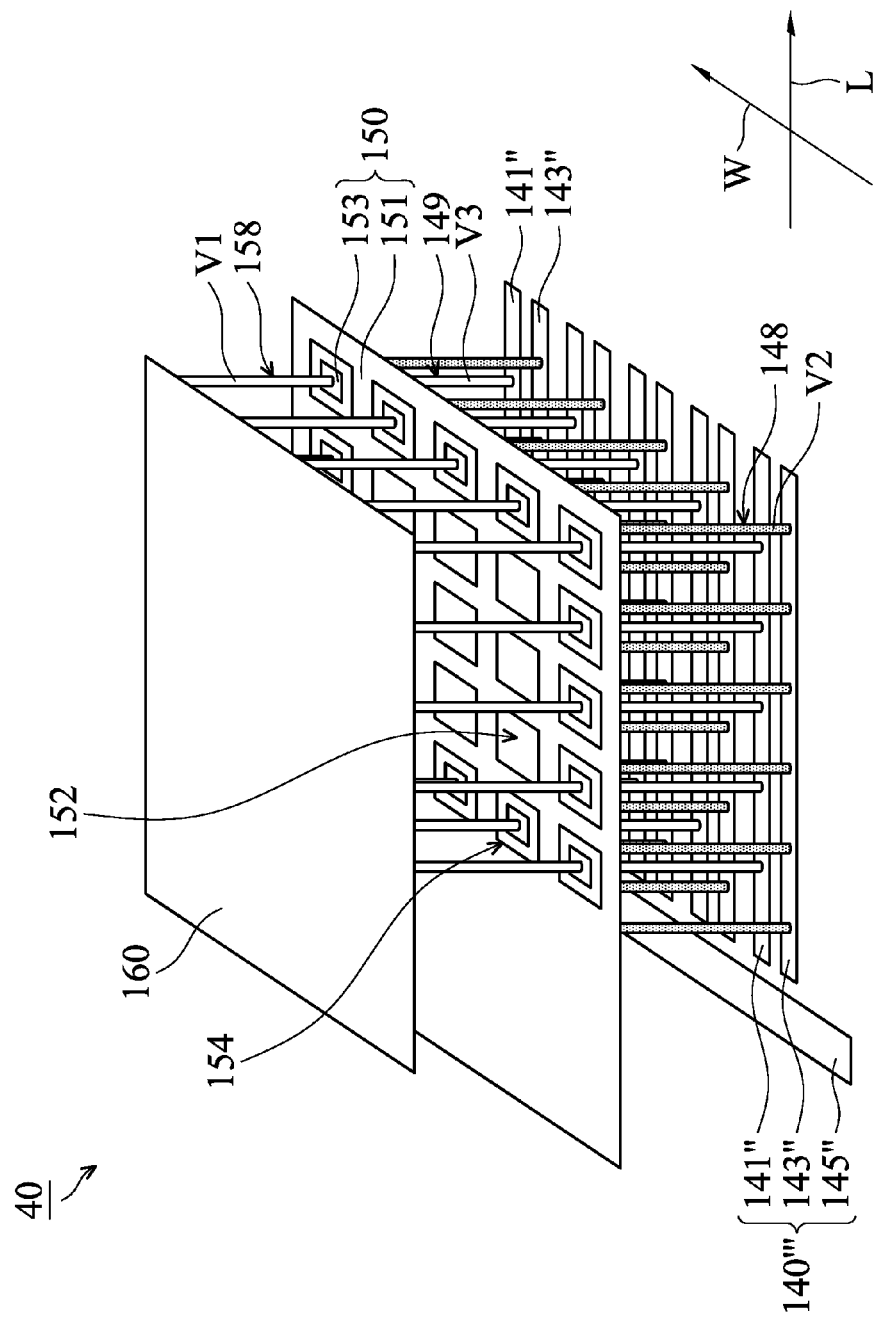
FIG. 4B is a perspective diagram showing a configuration of metal pattern layers and interconnect structures in the bonding pad structure shown in FIG. 4A.

Refer to FIGS. 4A and 4B, which respectively illustrate a cross section of a bonding pad structure 40 according to an embodiment of the present disclosure and a perspective diagram showing a configuration of metal pattern layers and interconnect structures in the bonding pad structure shown in FIG. 4A. Elements in FIGS. 4A and 4B that are the same as or similar to those in FIGS. 3A and 3B are not described again, for brevity. In the embodiment, the bonding pad structure 40 has a structure that is similar to the bonding pad structure 30 shown in FIGS. 3A and 3B except for the structure and configuration of the second metal pattern layer 140'.

Unlike the second metal pattern layer 140" of the bonding pad structure 30, the second metal pattern layer 140' that is directly below the first metal pattern layer 150 may further include a third strip portion 145". The third strip portion 145" may be perpendicular to the first strip portions 143" and the second strip portions 141" and adjacent to the end of each first strip portion 143" and the end of each second strip portion 141".

As shown in FIG. 4A, in the embodiment, the second strip portions 141" may be electrically connected to a first signal terminal of the circuit 105 (as indicated by the dashed-line 105a), such that the bonding pad 160 is electrically connected to the first signal terminal of the circuit 105. Moreover, the first strip portions 143" may be electrically connected to a second signal terminal of the circuit 105 that is different from the first signal terminal (not shown), such that the first body portion 151 is electrically connected to the second signal terminal of the circuit 105. Additionally, the third strip portion 145" may be electrically connected to a third signal terminal of the circuit 105 (as indicated by the dashed-line 105c).

In the embodiment, it should be understood that the bonding pad structure 40 may be formed by a method that is the same as or similar to the one used in manufacturing the bonding pad structure 10, the bonding pad structure 20, or the bonding pad structure 30.

According to the foregoing embodiments, since the first metal pattern layer of the bonding pad structure has hollowed-out patterns (i.e., the first openings in the central region and the second openings in the peripheral region) and island patterns (i.e., the island portions) in the second openings, the first metal pattern layer can be utilized to transmit two different signals.

Moreover, the first openings in the central region of the first metal pattern layer may be filled with the dielectric layer, so as to enhance the mechanical strength of the bonding pad, thereby preventing the bonding pad from damage during the wire bonding process.

Moreover, via plugs may be disposed on each of the island portions in the peripheral region of the first metal pattern layer, thereby preventing current crowding in the bonding pad and improving heat dissipation. As a result, high-power circuits or devices can be disposed directly below the bonding pad.

Additionally, the second metal pattern layer directly below the first metal pattern layer can further enhance the mechanical strength of the bonding pad and can be utilized to transmit more than two signals.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A bonding pad structure, comprising:
 a dielectric layer on a substrate;

a bonding pad disposed on the dielectric layer;

a first metal pattern layer embedded in the dielectric layer and directly below the bonding pad, wherein the first metal pattern layer comprises:

a first body portion having a plurality of first openings in a central region of the first body portion and a plurality of second openings arranged along a peripheral region of the first body portion and surrounding the plurality of first openings; and a plurality of first island portions correspondingly disposed in the plurality of second openings and spaced apart from the first body portion; and a plurality of first interconnect structures disposed in the dielectric layer and corresponding to the plurality of first island portions, such that the bonding pad is electrically connected to the plurality of first island portions, wherein each of the first interconnect structures comprises at least one via plug.

2. The bonding pad structure as claimed in claim 1, wherein the substrate has a circuit therein and the bonding pad and the first body portion are respectively and electrically connected to a first terminal and a second terminal of the circuit.

3. The bonding pad structure as claimed in claim 2, wherein the circuit is directly below the bonding pad.

4. The bonding pad structure as claimed in claim 1, further comprising:

a second metal pattern layer embedded in the dielectric layer and directly below the first metal pattern layer, wherein the second metal pattern layer comprises:

a second body portion having a plurality of third openings that is arranged to stagger the plurality of first openings and the plurality of second openings; and a plurality of second island portions correspondingly disposed in the plurality of third openings and spaced apart from the second body portion;

a plurality of second interconnect structures disposed in the dielectric layer and corresponding to the plurality of second island portions, such that the first body portion is electrically connected to the plurality of second island portions, wherein each of the second interconnect structures comprises at least one via plug; and a plurality of third interconnect structures disposed in the dielectric layer and corresponding to the plurality of first island portions, such that the second body portion is electrically connected to the plurality of first island portions, wherein each of the third interconnect structures comprises at least one via plug.

5. The bonding pad structure as claimed in claim 4, wherein the number of via plugs in each of the first interconnect structures is the same as or different from the number of via plugs in each of the second interconnect structures or the number of via plugs in each of the third interconnect structures.

6. The bonding pad structure as claimed in claim 1, further comprising:

a second metal pattern layer embedded in the dielectric layer and directly below the first metal pattern layer, wherein the second metal pattern layer comprises a plurality of first strip portions and a plurality of second strip portions that are parallel to each other and alternately arranged, and wherein each of the second strip portions is aligned with at least one of the plurality of first island portions;

a plurality of second interconnect structures disposed in the dielectric layer and corresponding to the plurality of first strip portions, such that the first body portion is electrically connected to the plurality of first strip portions, wherein each of the second interconnect structures comprises at least one via plug; and a plurality of third interconnect structures disposed in the dielectric layer and corresponding to the plurality of second strip portions, such that the plurality of second strip portions is electrically connected to the plurality of first island portions, wherein each of the third interconnect structures comprises at least one via plug.

7. The bonding pad structure as claimed in claim 6, wherein the number of via plugs in each of the first interconnect structures is the same as or different from the number of via plugs in each of the second interconnect structures or the number of via plugs in each of the third interconnect structures.

8. The bonding pad structure as claimed in claim 6, wherein the bonding pad and the first body portion have a rectangular shape, and wherein the plurality of first strip portions and the plurality of second strip portions are arranged parallel to the length direction or the width direction of the rectangular shape.

9. The bonding pad structure as claimed in claim 6, wherein the second metal pattern layer further comprises a third strip portion that is perpendicular to the plurality of first strip portions and the plurality of second strip portions and adjacent to the end of each of the first strip portions and the end of each of the second strip portions.

10. The bonding pad structure as claimed in claim 9, wherein the substrate has a circuit therein, and wherein the bonding pad, the first body portion, and the third strip portion are respectively and electrically connected to a first terminal, a second terminal, and a third terminal of the circuit.

* * * * *